United States Patent [19]

Lin

[11] Patent Number: 5,242,061

[45] Date of Patent: Sep. 7, 1993

[54] APPARATUS FOR POSITIONING INTERFACE CARDS IN A COMPUTER HOUSING

[75] Inventor: Wei-Ming Lin, Hsin-Tien, Taiwan

[73] Assignee: Mitac International Corp., Taiwan

[21] Appl. No.: 954,574

[22] Filed: Sep. 30, 1992

[51] Int. Cl.$^5$ .................. A47G 19/08; H05K 7/14; H01R 13/62

[52] U.S. Cl. .................. 211/41; 211/26; 361/801; 439/327

[58] Field of Search .................. 211/26, 41; 439/325, 439/327, 347; 361/380, 415, 427, 429

[56] References Cited

U.S. PATENT DOCUMENTS

| | | | |
|---|---|---|---|
| 4,890,198 | 12/1989 | Beam et al. | 361/415 X |
| 4,964,810 | 10/1990 | Malotke et al. | 361/415 X |
| 5,038,308 | 8/1991 | Le et al. | 361/415 X |
| 5,121,295 | 6/1992 | Lam | 361/415 X |
| 5,136,465 | 8/1992 | Benck et al. | 361/415 X |
| 5,138,526 | 8/1992 | Chung Hsiang | 361/415 X |
| 5,175,670 | 12/1992 | Wang | 361/380 X |

*Primary Examiner*—Leo P. Picard
*Assistant Examiner*—Michael W. Phillips
*Attorney, Agent, or Firm*—Ladas & Parry

[57] ABSTRACT

An apparatus for positioning interface cards in a computer housing includes a seat member and a locking member. The seat member has a first mounting plate and a second mounting plate connected perpendicularly to one another. A plurality of positioning channels are formed on the first mounting plate. Each of the positioning channels has a closed end and an open end. A resilient plate is provided on the second mounting plate by forming two slits in the second mounting plate. A projection is formed on the outside face of the resilient plate. The locking member has a first plate and a second plate perpendicularly connected to one side of the first plate. A U-shaped member is connected to the other side of the first plate and is connected slidably to the resilient plate of the second mounting plate. The locking member is moved along the slits of the second mounting plate between a first position, wherein the second plate faces the open ends of the positioning channels, and a second position, wherein the free edge of the second plate of the locking member is moved to face the outside face of the second mounting plate. The free edge of the base plate is thrust by the projection of the resilient plate in the first position.

3 Claims, 4 Drawing Sheets

APPARATUS FOR POSITIONING INTERFACE CARDS IN A COMPUTER HOUSING

BACKGROUND OF THE INVENTION

1. Field of the Invention

This invention relates to an apparatus for positioning interface cards in a computer housing, more particularly to a positioning apparatus which has a simple structure and is convenient to operate.

2. Description of the Related Art

FIG. 1 shows a conventional apparatus for positioning interface cards which are used for connecting a computer and computer peripheral devices. The conventional positioning apparatus comprises a seat member (A), which is to be fixed to the computer housing, and a locking member (B). The seat member (A) is formed from a plate member (A2) which has a plurality of parallelly spaced elongated positioning channels (A1) at one side thereof. Each of the positioning channels (A1) has a closed end (A11) and an open end (A12). Two projections (A14) are formed on the other side of the plate member (A2) at the side edge (A21) of the same, which side edge (A21) is adjacent to the open end (A12) of the positioning channels (A1). Each of the projections (A14) has a fixing hole (A13) formed therein. An elongated locking member (B) is attached to the seat member (A) by inserting two expansion bolts (C) into the two fixing holes (A13) through the locking member (B), respectively. The locking member (B) has a flat portion (B1) which abuts perpendicularly the side edge (A21) of the plate member (A2). Therefore, the interface cards can be positioned in the positioning channels (A1) between the closed ends (A11) and the flat portion (B1) of the locking member (B). Before inserting the interface cards into the positioning channels (A1), the locking member (B) must be detached from the seat member (A). The expansion bolts (C) must be inserted into and removed from the fixing holes (A13) when the interface cards are mounted or dismounted. This can inconvenience the user. In addition, the conventional positioning apparatus comprises the seat member (A), the locking member (B) and two expansion bolts (C). The structure of the conventional positioning apparatus is somewhat complicated.

SUMMARY OF THE INVENTION

It is therefore a main object of this invention to provide an apparatus for positioning interface cards in a computer housing which positioning apparatus can be conveniently operated.

It is another object of this invention to provide an apparatus for positioning interface cards in a computer housing which positioning apparatus has a simple structure when compared to the conventional positioning apparatus.

Accordingly, an positioning apparatus of the present invention is used to position interface cards in a computer housing and comprises:

a seat member having a first mounting plate with a first side edge and a second side edge opposed to the first side edge, and a second mounting plate having a third side edge connected perpendicularly to the second side edge of the first mounting plate and a fourth side edge opposed to the first side edge;

a plurality of parallelly spaced elongated positioning channels extending from the first side edge to the second side edge of the first mounting plate, each of the positioning channels having a closed end and an open end respectively located adjacent the first and second side edges;

two parallelly spaced slits extending from the third side edge to the fourth side edge of the second mounting plate, thereby defining a resilient plate between the two slits, the resilient plate having a projection formed on the outside face thereof; and a locking member including a first plate having a second plate connected perpendicularly to a first edge of the first plate at one side of the first plate, a U-shaped member having a rectangular base plate and two opposed arm plates connected to the base plate, and a sliding groove confined therein, the base plate being connected perpendicularly to a second edge opposed to the first edge at the other side of the first plate, the arm plates being respectively inserted into two slits of the second mounting plate with the sliding groove of the U-shaped member receiving the resilient plate of the second mounting plate and the second edge of the first plate abutting the outside face of the second mounting plate, the arm plates further having means for preventing the arm plates of the U-shaped member from disengaging from the resilient plate in a direction transverse to a moving direction of the locking member, thus allowing the locking member to move along the slits of the second mounting plate between a first position, wherein the second plate faces the open ends of the positioning channels so that the interface cards can be positioned between the closed ends of the positioning channels and the second plate of the locking member, and a second position, wherein a free edge of the second plate of the locking member is moved to face the outside face of the second mounting plate, a free edge of the base plate of the U-shaped member being thrust by the projection of the resilient plate in the first position in order to prevent the locking member to move away from the first position.

Therefore, a user can bend the free end of the resilient plate in order to allow the locking member to disengage from the projection of the resilient plate and move to the second position, and then insert the interface cards into the positioning channels and push the locking member to slide over the projection of the resilient plate to the first position. The locking member need not be removed from the seat member, thus simplifying the operation of the positioning apparatus. In addition, the positioning apparatus comprises two components which are simple in structure when compared to the prior art.

BRIEF DESCRIPTION OF THE DRAWINGS

Other features and advantages of this invention will become apparent in the following detailed description of a preferred embodiment of this invention with reference to the accompanying drawings, in which.

DETAILED DESCRIPTION OF THE PREFERRED EMBODIMENT

Figure 1:
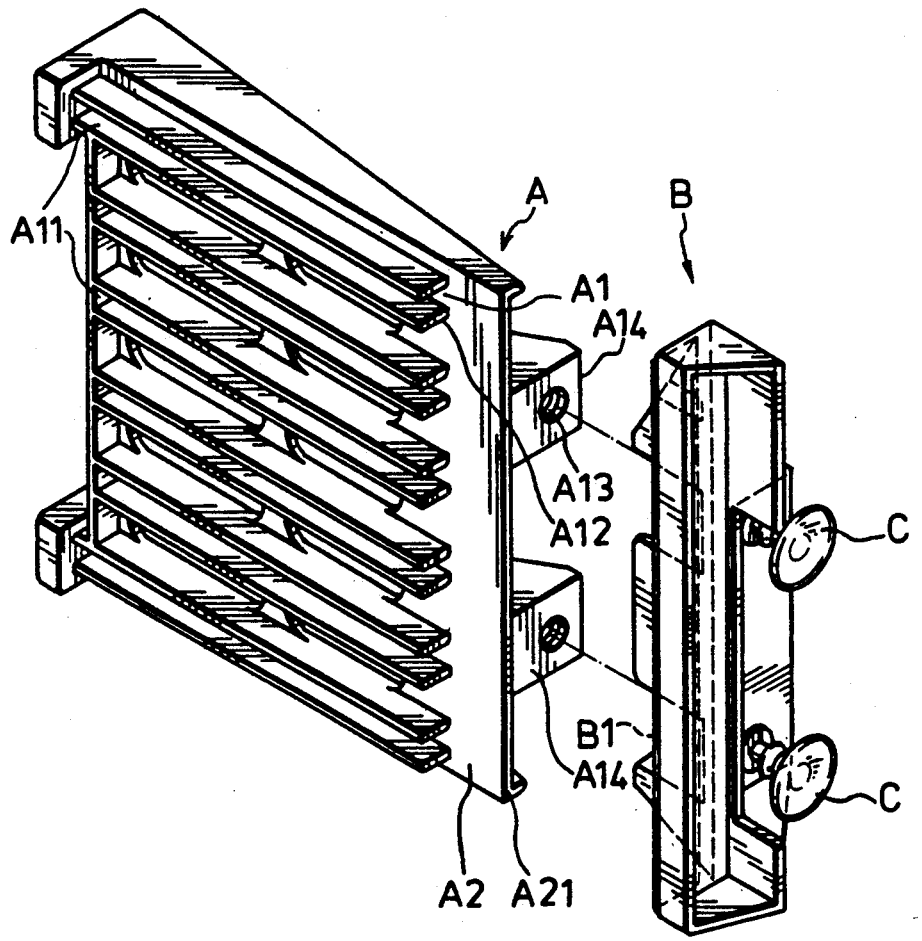
FIG. 1 is a partially perspective exploded view of a conventional apparatus for positioning interface cards in a computer housing.
Figure 2:
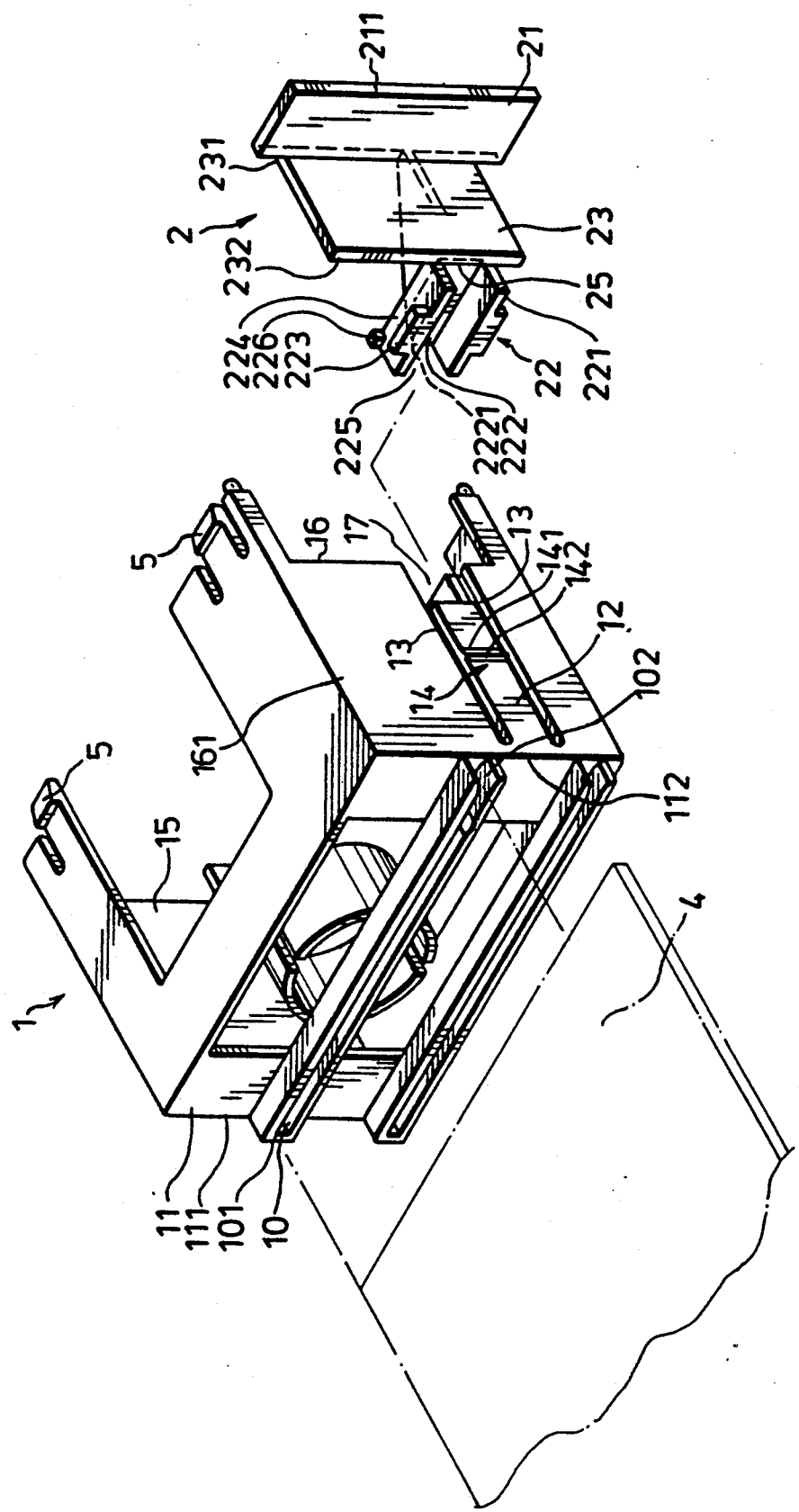
FIG. 2 is a perspective exploded view of a preferred embodiment of an apparatus of this invention, which apparatus is use to position interface cards in a computer housing.
Figure 6:
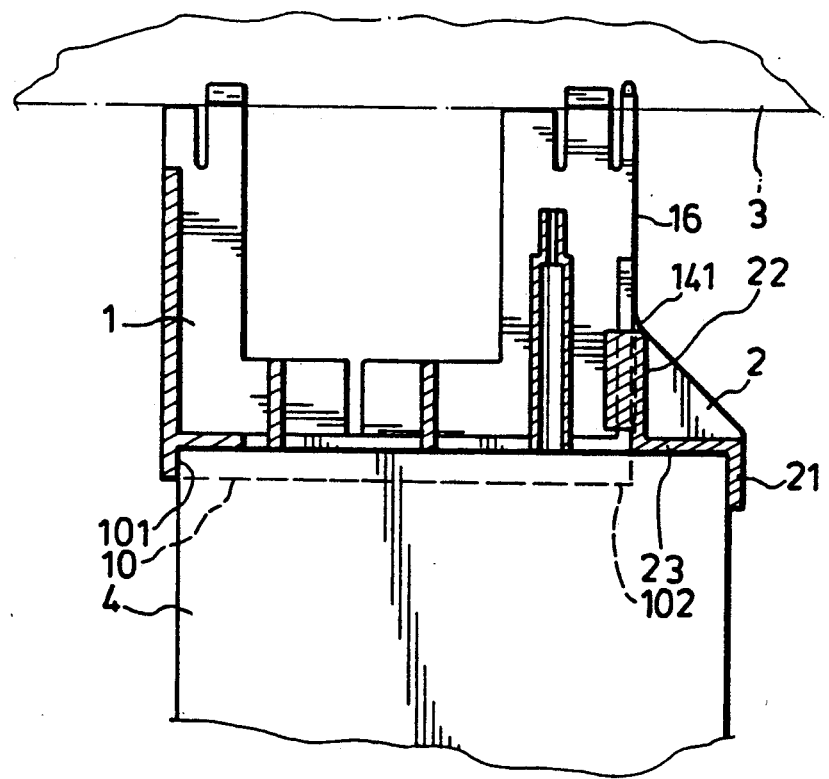
FIG. 6 is a sectional top schematic view illustrating the positioning apparatus of this invention when connected to the computer housing and to the interface cards.

FIG. 2 shows a perspective exploded view of a preferred embodiment of an apparatus for positioning interface cards in a computer housing. The positioning apparatus includes a seat member 1 and a locking member 2 which are both made of a plastic material. The seat member 1 has a first mounting plate 11 and two opposed second mounting plates, 15 and 16, respectively perpendicularly extending from a first side edge 111 and a second side edge 112 opposed to the first side edge of the first mounting plate 11. The free sides of the second mounting plates 15, and 16, have snap engaging members 5 adapted to engage the computer housing 3, as shown in FIG. 6. A plurality of parallelly spaced elongated positioning channels 10 extend from the first side edge 111 to the second side edge 112 of the first mounting plate 11. Each of the positioning channels 10 has a closed end 101 and an open end 102 respectively located adjacent the first and second side edges, 112, of the first mounting plate 11.

One of the second mounting plates 16 has a notch 17 extending from the side edge connected with the first mounting plate 11 to the free side edge of the second mounting plate 16. A resilient plate 12 extends from the bottom of the notch 17. Two parallelly spaced silts 13 are formed between the resilient plate 12 and the second mounting plate 16. A projection 14 is formed on the outside face of the resilient plate 12. The projection 14 is formed with an inclined face 141 adjacent to the free side edge 211 of the second mounting plate and a vertically thrust face 142 adjacent to the first mounting plate 11.

The locking member 2 includes a first plate 23 having a second plate 21 connected perpendicularly to a first edge 231 of the first plate 23 at one side of the first plate 23. A U-shaped member 22 has a rectangular base plate 222, two opposed arm plates 221 extending perpendicularly from the base plate 222 in a direction away from the second plate 21, and a sliding groove 225 confined therein. The base plate 222 is connected perpendicularly slightly away from a second edge 232 which is opposed to the first edge 231 at the other side of the first plate 23. A shoulder 25 is formed between the base plate 222 and the first plate 23. A pair of first protrusions 223 are respectively formed on the outside face 224 of the arm plates 221 of the U-shaped member 22 near the free edges of the arm plates 221. Two second protrusions 226 are formed on the outside face 224 of the arm plates 22 adjacent to the base plate 222 and the free edge 2221 of the same.

Figure 3:
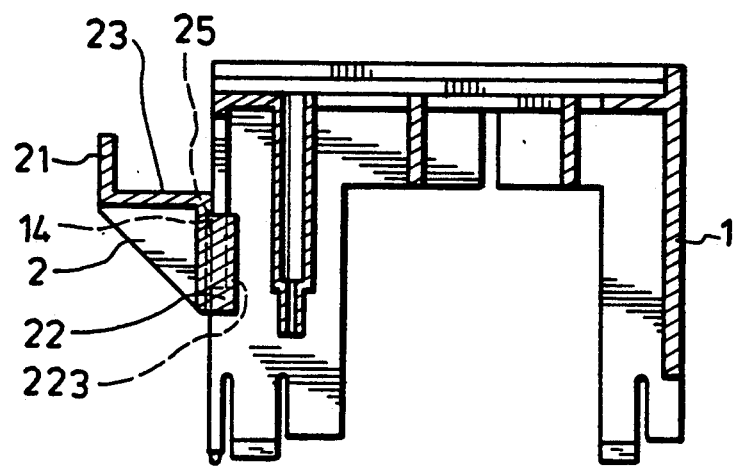
FIG. 3 is a sectional top view of the positioning apparatus of this invention, in which the locking member is in a second position.
Figure 4:
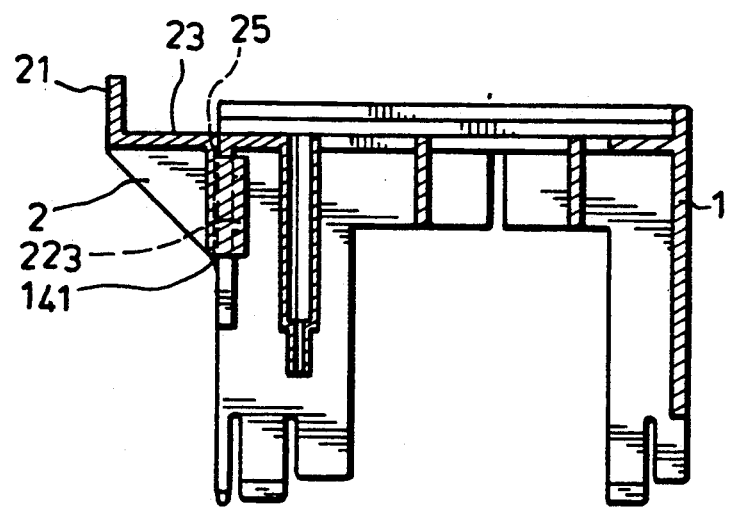
FIG. 4 is a sectional top view of the positioning apparatus of this invention, in which the locking member is in a first position.
Figure 5:
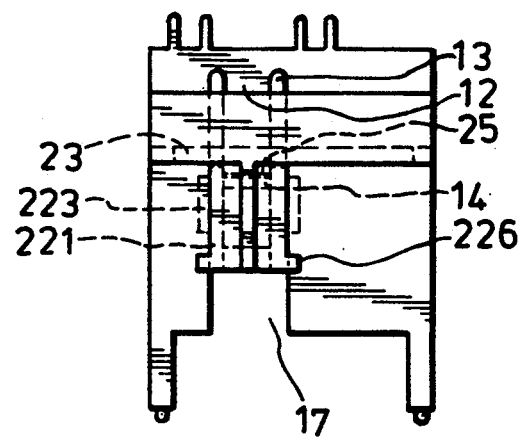
FIG. 5 is a side view of the positioning apparatus of this invention, in which the locking member is in the second position.

During assembly, the arm plates 221 are respectively inserted into slits 13 of the second mounting plate 16 with the sliding groove 225 of the U-shaped member 22 receiving the resilient plate 12 and the second edge 232 of the first plate abutting the outside face 161 of the second mounting plate 16, as illustrated in FIG. 3. The shoulder 25 slides over the inclined face 141 of the projection 14 of the resilient plate 12. The first protrusions 223 abut the inside face of the second mounting plate 16, which is opposed to the outside face 161 of the second mounting plate 16, and the second protrusions 226 abut the outside face 161 of the second mounting plate 16 when the U-shaped member 22 slides along the slits 13. The first protrusions 223 prevent arm plates 221 of the U-shaped member 22 from disengaging from the resilient plate 12 in a direction transverse to a moving direction of the locking member 2. The second protrusions 226 prevent the locking member 2 from being rotated counterclockwise when the U-shaped member 22 slides along the slits 13. Therefore, the locking member 2 can be moved stably along the slits 13 of the second mounting plate 16 between a first position, wherein the second plate 21 faces the open ends 102 of the positioning channels 10, as best illustrated in FIG. 4, and a second position, wherein the free edge 211 of the second plate 21 is moved to face the outside face 161 of the second mounting plate 16, as shown in FIGS. 3 and 5. The free edge 2221 of the base plate 222 of the U-shaped member 20 is thrust by the thrust face 142 of the projection 14 of the resilient plate 12 in the first position in order to hold the locking member 2 in the first position. The shoulder 25 is thrust by the thrust face 142 of the projection 14 of the resilient plate 12, thus preventing the locking member 2 from being pulled away from the notch 17 in a direction parallel to the moving direction of the locking member 2. When the locking member 2 is in the second position, a user can insert the interface cards 4 into the positioning channels 10 and push the locking member 2 to slide over the projection 14 of the resilient plate 12 to the first position. Therefore, the interface cards 4 can be positioned between the closed ends 101 of the positioning channels 10 and the second plate 21 of the locking member 2, as best illustrated in FIG. 6. When removing the interface cards 4 from the positioning channels 10, the free end of the resilient plate 12 is bent in order to allow the free edge 2221 of the base plate 222 of the U-shaped member 22 of the locking member 2 to disengage from the projection 14 of the resilient plate 12 and to move the locking member 2 to the second position. The locking member 2 need not be removed from the seat member 1, thus simplifying the operation of the positioning apparatus. In addition, the positioning apparatus comprises two components which are simple in structure when compared to the prior art.

With this invention thus explained, it is apparent that numerous modifications and variations can be made without departing from the scope and spirit of this invention. It is therefore intended that this invention be limited only as indicated in the appended claims.

I claim:

1. An apparatus for positioning interface cards in a computer housing, said apparatus comprising:

a seat member having a first mounting plate with a first side edge and a second side edge opposed to said first side edge, and a second mounting plate having a third side edge connected perpendicularly to said second side edge of said first mounting plate and a fourth side edge opposed to said first side edge, said first mounting plate having a plurality of parallelly spaced elongated positioning channels extending from said first side edge to said second side edge, each of said positioning channels having a closed end and an open end respectively located adjacent said first and second side edges, said second mounting plate having two parallelly spaced silts extending from said third side edge to said fourth side edge, thereby defining a resilient plate between said two slits, said resilient plate having a projection formed on an outside face thereof; and
a locking member including a first plate having a second plate connected perpendicularly to a first edge of said first plate at one side of said first plate, a U-shaped member having a rectangular base plate and two arm plates connected to said base plate, and a sliding groove confined therein, said base plate being connected perpendicularly to a second edge opposed to said first edge at the other side of said first plate, said two arm plates being respectively inserted into two slits of said second mounting plate with said sliding groove of said U-shaped member receiving said resilient plate of said second mounting plate and said second edge of said first plate abutting an outside face of said second mounting plate, said arm plates further having means for preventing said arm plates of said U-shaped member from disengaging from said resilient plate in a direction transverse to a moving direction of said locking member, thus allowing said locking member to move along said slits of said second mounting plate between a first position, wherein said second plate faces said open ends of said positioning channels so that said interface cards can be positioned between said closed ends of said positioning channels and said second plate of said locking member, and a second position, wherein a free edge of said second plate of said locking member is moved to face said outside face of said second mounting plate, a free edge of said base plate of said U-shaped member being thrust by said projection of said resilient plate in said first position in order to prevent said locking member to move away from said first position.

2. An apparatus as claimed in claim 1, wherein said preventing means includes a first protrusion formed on an outside face of one of said arm plates of said U-shaped member, said first protrusion abutting an inside face of said second mounting plate, which is opposed to said outside face of said second mounting plate, when said U-shaped member is slidably inserted in said slits.

3. An apparatus as claimed in claim 2, further comprising a second protrusion formed on said outside face of one of said arm plates, said second protrusion abutting said outside face of said second mounting plate.

* * * * *